United States Patent [19]
Jain

[11] Patent Number: 5,933,758
[45] Date of Patent: Aug. 3, 1999

[54] METHOD FOR PREVENTING ELECTROPLATING OF COPPER ON AN EXPOSED SURFACE AT THE EDGE EXCLUSION OF A SEMICONDUCTOR WAFER

[75] Inventor: Ajay Jain, Austin, Tex.

[73] Assignee: Motorola, Inc., Schaumburg, Ill.

[21] Appl. No.: 08/854,735

[22] Filed: May 12, 1997

[51] Int. Cl.$^6$ .......................... H01L 21/48; H01L 21/283
[52] U.S. Cl. .......................... 438/687; 438/644; 438/685
[58] Field of Search ..................... 438/685, 644, 438/634, 687, 645, 692; 257/915, 751

[56] References Cited

U.S. PATENT DOCUMENTS

| | | | |
|---|---|---|---|
| 4,118,595 | 10/1978 | Pfahnl et al. | 438/623 |
| 4,381,215 | 4/1983 | Reynolds et al. | 438/643 |
| 5,342,806 | 8/1994 | Asahina | 438/608 |
| 5,391,517 | 2/1995 | Gelatos et al. | 438/644 |
| 5,580,668 | 12/1996 | Kellam | 428/610 |
| 5,677,244 | 10/1997 | Venkatraman | 438/643 |
| 5,773,889 | 6/1998 | Love et al. | 257/737 |
| 5,821,168 | 10/1998 | Jain | 438/692 |
| 5,821,620 | 10/1998 | Hong | 257/751 |

*Primary Examiner*—Michael Trinh
*Assistant Examiner*—Maria Guerrero

[57] ABSTRACT

A method for forming a copper interconnect (54) begins by depositing a barrier layer (48). An intermediate layer (50) is formed over the barrier layer (48) by exposing the barrier layer (48) to a plasma silane environment. The layer (50) is conductive when deposited so that contact resistance is not affected. The layer (50) is insitu covered with a copper seed layer (52). The layer (52) is not formed in an edge exclusion region (20) thereby exposing a portion (50a) of the layer (50). This portion (50a) will natively oxidize in a room ambient to form a copper electroplating prevention barrier whereby copper will not electroplate in the region (20). Therefore, the region (50a) prevents barrier-to-copper interfaces to avoid delamination of the copper while preserving the edge exclusion region desired for copper electroplating.

25 Claims, 3 Drawing Sheets

METHOD FOR PREVENTING ELECTROPLATING OF COPPER ON AN EXPOSED SURFACE AT THE EDGE EXCLUSION OF A SEMICONDUCTOR WAFER

FIELD OF THE INVENTION

The present invention relates generally to semiconductor manufacturing, and more particularly to, preventing adverse copper electroplating at the edge of a semiconductor wafer.

BACKGROUND OF THE INVENTION

In the integrated circuit industry, copper interconnects are typically utilized to connect one electrical point to another electrical point along the surface of a semiconductor wafer. In order to form these copper interconnects, a copper electroplating process is typically utilized to form a blanket copper layer over the wafer. This blanket copper layer is then chemically-mechanically polished to form the copper interconnects within trenches previously etched in dielectric material. However, conventional blanket copper electroplating causes some adhesion problems at the periphery of the semiconductor wafer which increases particulate problems and reduces yield As an example, FIG. 1 illustrates the prior art copper electroplating operation. In FIG. 1, a base layer 11 or substrate 11 is provided. The base layer 11 contains the semiconductor wafer along with any dielectric and conductive layers needed over the semiconductor wafer to form active electrical devices. In order to connect these electrical devices to each other, a barrier layer 13 is first formed over the substrate 11. The barrier layer 13 prevents subsequently-formed copper regions from adversely affecting underlying semiconductor and metallic regions. Overlying the barrier layer 13 is formed a seed layer 15. It has been found in the art that the seed layer 15 should be separated from the edge of the substrate 11 by an edge exclusion distance 20 as illustrated in FIG. 1. The edge exclusion region 20 is utilized for the electroplating operation to avoid some wafer edge-effect problems, but the edge exclusion also creates some material interface problems.

For example, if seed layer 15 were to extend to the very edge of the wafer 11, then the copper electroplating operation would result in copper material forming beyond the edge of the wafer and potentially down a sidewall of the wafer. This additional sidewall material cannot be removed by conventional chemical etching or mechanical polishing. This peripheral copper formation would thereby create sidewall abnormalities that could result in damage to the wafer or the inability of the wafer to be properly processed within semiconductor equipment. Therefore, the seed layer 15 is separated from the edge of the wafer 11 via the exclusion region 20 to avoid these problems, but creates yet another problem discussed below.

After formation of the seed layer, the seed layer 15 is exposed to a liquid electroplating bath whereby a copper layer 17 is electroplated not only from the seed layer 15 but from exposed portions of the barrier layer 13 in the edge exclusion region 20 as illustrated in FIG. 1. The seed layer 15 will electroplate copper more effectively than the barrier layer 13 thereby resulting in the edge exclusion copper topography illustrated in FIG. 1 for the copper layer 17. Note that due to the exclusion region, copper region 17 is now in direct contact with a barrier region 13.

As illustrated in FIG. 2, adhesion between a copper layer 17 and a typical barrier layer 13, such as titanium nitride (TiN), is extremely poor. Therefore, when copper 17 is in contact with the barrier 13 in the exclusion region 20, as illustrated in FIG. 2, flaking or peeling 19 between the copper 17 and the barrier 13 is inevitable. This flaking, delamination, or peeling 19 between the copper 17 and the barrier layer 13 in the edge exclusion region 20 reduces the yield of semiconductor devices and creates particulate problems in processing chambers. Device yield along the periphery of the wafer is impacted most profoundly.

Therefore, a need exists for a copper electroplating process which prevents electroplating of copper on an exposed edge exclusion region of a semiconductor wafer whereby barrier material is not placed in contact with electroplated copper.

Figure 1:
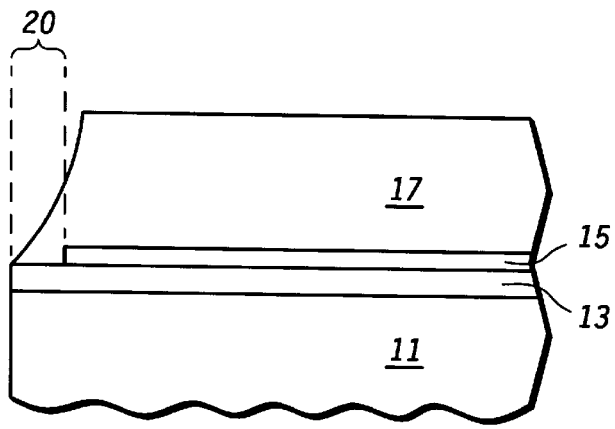
FIG. 1 illustrates, in a cross sectional diagram, a prior art method for electroplating copper on a semiconductor wafer.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention involves forming an intermediate layer between a titanium nitride (TiN) barrier layer and a copper seed layer. The intermediate layer is an oxidizable conductive layer which is selectively oxidized to prevent copper electroplating on an edge exclusion of a silicon wafer (i.e., a periphery of the semiconductor wafer). The copper seed is then used to form a thicker layer of copper via electroplating in order to form dual inlaid (i.e., Damascene) contacts. The intermediate layer serves an important function. The intermediate layer between the TiN barrier and the copper seed layer will have a first portion and a second portion The first portion will lie over the exclusion region and be ambient-exposed for oxidation while the second portion underlies the copper seed and remained conductive/semiconductive.

Therefore, the intermediate layer is a semiconductive or conductive layer which will not substantially increase or adversely affect contact resistance within the dual in-laid contact, while exposed portions of the intermediate layer within the edge exclusion region 20 are readily oxidizable in a room ambient which contains oxygen. It is this oxidized portion which provides copper electroplating prevention in the exclusion region 20. The selective prevention of copper electroplating within the exclusion regions 20 provides an improved embodiment over the prior art embodiment of FIGS. 1–2. By avoiding electroplating of copper in the edge exclusion region, copper within the dual inlaid interconnect will never be directly connecting titanium nitride within the edge exclusion region 20 as illustrated in FIG. 2 whereby the peeling 19 of FIG. 2 will be either entirely avoided or substantially avoided using the process described herein.

The invention can be further understood with reference to FIGS. 3–8.

Figure 3:
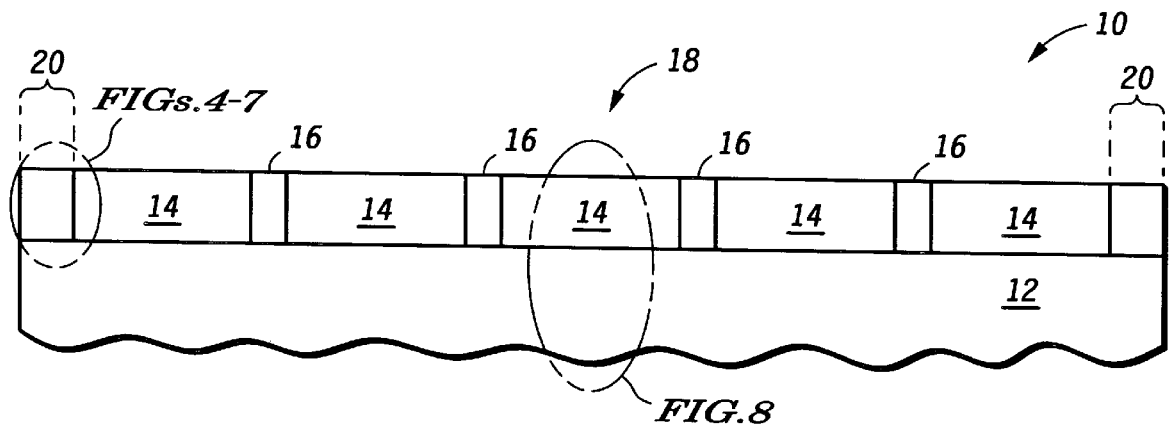
FIG. 3 illustrates, in a cross sectional diagram, a semiconductor wafer in accordance with the present invention.

FIG. 3 illustrates a semiconductor substrate 10. In a preferred form, the semiconductor substrate 10 is a silicon wafer. However, the processing taught herein can be utilized for flat panel displays, multi-chip modules (MCMs), other semiconductor wafer such as germanium wafers and gallium arsenide wafer, and like substrate materials. In the most preferred form, the semiconductor substrate 10 comprises a silicon wafer 12 which is substantially circular in shape. Integrated circuits 14 are formed overlying the semiconductor wafer 12 as illustrated in FIG. 3. The integrated circuit die 14 of FIG. 3 are separated from one another by scribe lines 16. Scribe lines 16 are present so that the integrated circuits 14 can be segmented from one another to form a plurality of singulated integrated circuits 14 which are then subsequently packaged for consumer use.

Around a circular periphery of the wafer 12 is an exclusion region 20. The exclusion region 20 identifies a periphery portion of the wafer wherein the copper electroplating should not occur in order to improve integrated circuit yield by avoiding the problems identified in FIGS. 1–2. This edge exclusion portion is magnified and illustrated via FIGS. 4–7 herein to illustrate the specific process by which copper electroplating in an edge exclusion region 20 is either reduced or completely eliminated whereby integrated circuit yield is improved. Furthermore, FIG. 8 illustrates a magnified portion of an integrated circuit device 14, as identified in FIG. 3, in order to illustrate the internal contents of a typical IC 14 which is formed via the edge exclusion process taught in FIGS. 4–7. All of the functional integrated circuits 14 of FIG. 3 lie within a central portion 18 of a semiconductor wafer 12 whereby the lack of electroplating occurring within the exclusion region 20 will not support functional integrated circuit (IC) formation.

Figure 4:
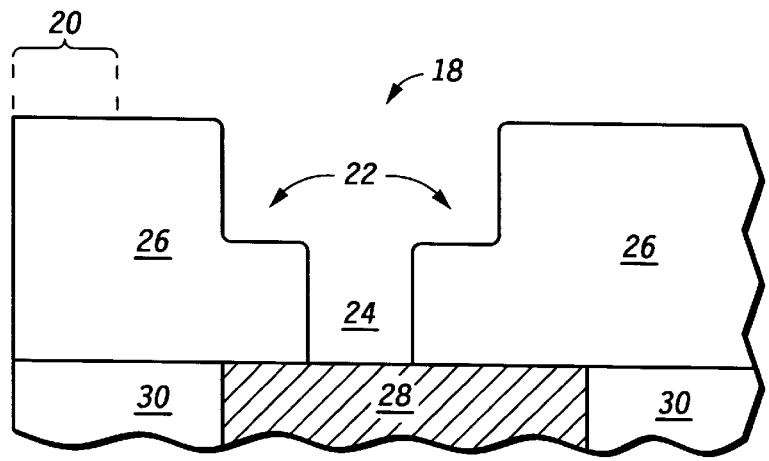
FIGS. 4–7 illustrate, in cross sectional diagrams, a method for forming an improved edge exclusion region for use with copper electroplating which avoid or reduces prior art delamination problems in accordance with the present invention.

FIGS. 4–7 illustrate a magnified view of the edge exclusion region 20 and a portion of an integrated circuit (IC) portion 14 identified in FIG. 3. FIG. 4 illustrates that an inter-level dielectric (ILD) 30 is formed. Typically, the inter-level dielectric (ILD) 30 is a tetraethylorthosilicate (TEOS) layer. This layer 30 is lithographically patterned and etched using conventional techniques in order to form vias and/or trenches. The vias and/or trenches can form conventional interconnect structures or dual in-laid structures as taught herein in FIGS. 4–7. Therefore, conductive interconnects and/or conductive contacts 28 are formed within opening of the inter-level dielectric 30 in order to form a first metallic interconnect layer. Note than one or more local interconnect layers, such a polysilicon or tungsten, may underlie the layer 28. Typically, the interconnect 28 is formed from copper as taught herein in FIGS. 4–7. However, the layer 28 may be formed from aluminum, aluminum-copper, aluminum-silicon-copper, silver, gold, or any other like metallic conductive material or composite thereof.

After formation of the metal interconnect 28, one or more inter-level dielectric (ILD) layers 26 are formed as illustrated in FIG. 4. A dual in-laid structure is etched within the inter-level dielectric 26. The dual in-laid structure contains trench portions 22 and via portions 24 as illustrated in FIG. 4. The via portions 24 are, in most devices, a plurality of via portions separated from one another along the semiconductor wafer. Multiple vias are needed to make electrical contact to one or more underlying conductive interconnect regions such as region 28 of FIG. 4. The separated and segmented regions 24 dispersed across the wafer to contact various underlying conductive regions are interconnected selectively to one another via the trench portions 22. Together the trench portions 22 and via portions 24 form the one or more dual in-laid structure over the surface of the wafer.

In a preferred form, the region 26 is formed by first depositing a plasma enhanced nitride (PEN) passivation layer over the top of layer 28. This PEN layer (not specifically illustrated in FIG. 4) is then followed by a first TEOS deposition to form a TEOS region laterally adjacent to the opening 24. Then, an etch stop layer (not specifically illustrated in FIG. 4) is typically formed above this first deposited TEOS layer in order to allow for easier etch processing when forming the different regions 22 and regions 24 of FIG. 4. This etch stop layer, would reside at or near the interface between the opening 24 and the opening 22 if specifically illustrated in FIG. 4. After formation of this etch stop layer, a second TEOS deposition is used to form the TEOS material which is laterally adjacent the opening or trench 22 in FIG. 4.

Typically, a thickness of the TEOS layer 30 and the first metallic layer 28 is roughly 4000–5000 angstroms in thickness. The entire layer 26 in FIG. 4 is typically on the order of 13,000 angstroms with the via portion being roughly 8000 angstroms in depth and the trench portion 22 being roughly 5000 angstroms in depth. The openings 22 and 24 are processed by conventional TEOS etch technology such as the use of plasma $CF_4$ and $CHF_3$ processing.

Figure 2:
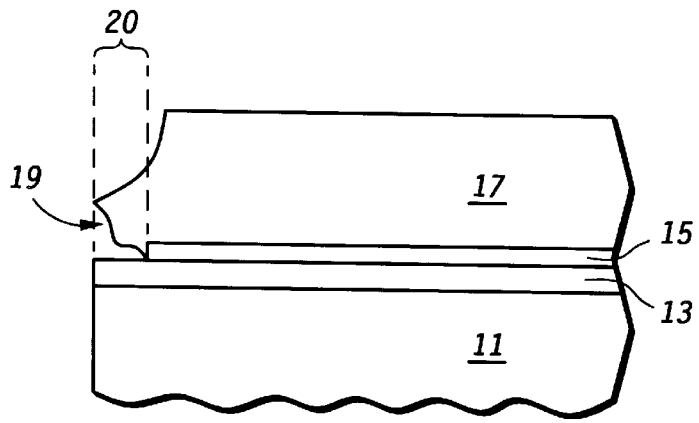
FIG. 2 illustrates, in a cross sectional diagram, a prior art problem of edge exclusion peeling or delamination which reduces integrated circuit yield and increases particle problems in processing chambers.

FIG. 4 also clearly illustrates the edge exclusion region 20 as previously illustrated in FIGS. 1–3. In a preferred form, the edge exclusion region 20 is 2 mm in width and surrounds an outer peripheral surface of the circular wafer 12. However, the edge exclusion can be altered in thickness around an optimal width of 2 mm so that edge exclusion regions of roughly 1 mm to 3 mm or more will be fully functional.

Figure 5:
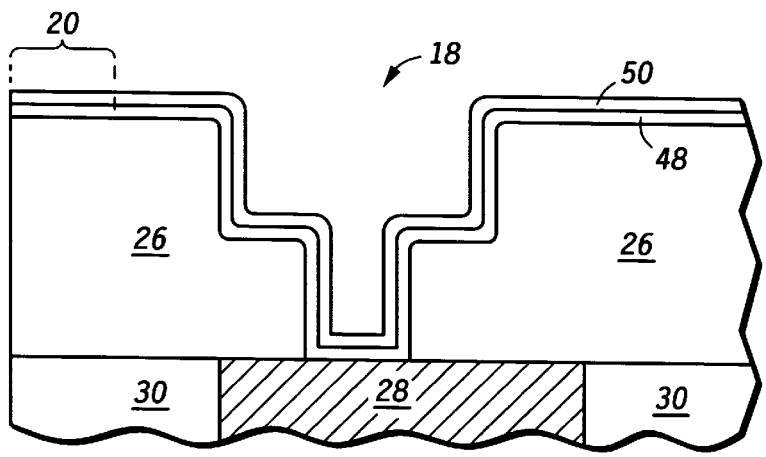

FIG. 5 illustrates that a barrier layer 48 is deposited over the inter-level dielectric 26 and within the dual inlaid contact openings 22 and 24. In a preferred form, the layer 48 is a titanium nitride (TiN) layer which is formed by chemical vapor deposition (CVD). In yet another form, the layer 48 may be a composite barrier which comprises a titanium nitride (TiN) portion. For example, the layer 48 may comprise titanium-tungsten, a refractory silicide, tantalum nitride, tantalum silicon nitride, or like barrier layers in addition to or in lieu of the TiN layer 48. In a preferred form, layer 48 is roughly 200 angstroms in thickness, however, this thickness can be altered while still rendering a functional device.

Overlying the barrier 48 is formed an intermediate layer 50. Intermediate layer 50 is formed by placing the semiconductor wafer in a vacuum environment and exposing the semiconductor wafer to a silane ($SiH_4$) plasma. The silane plasma is generated in a high density plasma chamber, such as an Applied Materials Centura chamber, utilizing a chamber power of roughly 100 Watts. The heater within the chamber is set to roughly 450° C. whereby the substrate/wafer temperature is roughly 360° C. Silane is flowed into the chamber at a rate of roughly 10 ccm at a chamber pressure of roughly 1 Torr. In addition to the 10 ccm silane flow, roughly 600 ccms of Argon flow is used as an inert carrier for the silane. This exposure of the barrier layer 48 to a silane plasma is very brief in time and is typically on the order of roughly one second in duration. This short exposure to a silane plasma will form a thin (e.g., roughly 2 angstrom to 20 angstrom) silicon comprising film 50 on the surface of the barrier layer 48.

Specific processing parameters used to form the layer 50 are described hereinabove. However, it should be understood that the preferred pressure of 1 Torr can be altered between 1 mTorr and atmospheric pressure (preferably between 100 mTorr and 3 Torr). The preferred temperature of 450° C. can be varied between room temperature and 500° C. The flow rate of silane can be changed between 1 ccm and 500 ccms with the Argon flow changing accordingly. Typically, the ratio of silane to Argon is on the order of 1:50. The time of exposure, as taught hereinabove, can be set to a time duration between a fraction of a second and several seconds.

The resulting intermediate layer 50 on the surface of the barrier layer 48 is a silicon-containing material. Initially, the layer 50 is formed as preferably a 6 angstrom thick silicon (Si) layer. However, the silicon layer, under certain ambient conditions, will quickly react with any refractory metal, such as titanium, contained within the barrier layer 48. Therefore, the 6 angstroms of silicon deposited on the surface on the wafer to form the layer 50 from the silane plasma may be either: (1) a complete layer of unreacted silicon; (2) a composite of silicon and a refractory silicide formed from reaction with layer 48; or (3) may be an entirely consumed silicon layer whereby layer 50 is an entire refractory silicide material. In any event, silicon from the silane plasma adheres to the barrier layer 48 to form a very thin 2 to 20 angstrom (preferably 6 angstrom) layer 50 which comprises silicon atoms and is at least semiconductor in resistivity.

It should be noted that the silicon layer 50 can be doped with one or more of boron, phosphorous, arsenic, and or like Si-compatible dopant atoms in order to change the resistivity of this thin layer 50. Therefore, the conductivity of the layer 50 can be controlled so that the resistive effects on contact resistance are negligible. In any event, even without Si doping, the layer 50 is typically thin enough and typically silicided enough to have a negligible or unmeasurable effect on the contact resistance of Damascene structures. Notice that the intermediate layer 50 is formed both in the central portion 18 of the wafer and the edge exclusion portion 20 of the wafer to entirely cover the barrier layer 48.

In other embodiments, the silane plasma used herein can be replaced with a different plasma or a sputter process such that the layer 50 can be formed by one or more of: magnesium, germanium, aluminum, or a like conductive material or composite thereof. In a preferred form, a layer selected for use as the intermediate layer 50 should be a conductive or semiconductive material when deposited so that the layer 50 does not adversely effect contact resistance. However, the material used to form layer 50 should also be readily oxidized under specific environmental constraints or inert to the subsequent copper electroplating process (see FIG. 7).

Figure 6:
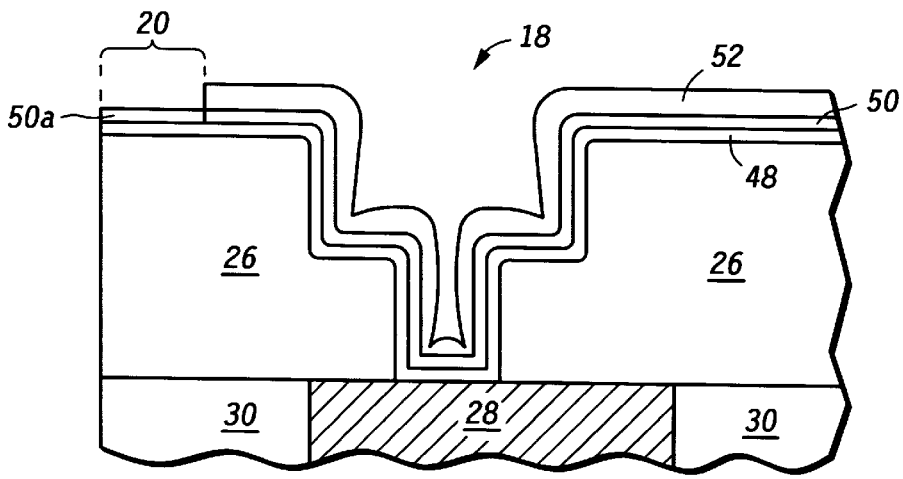

FIG. 6 illustrates that a copper electroplating seed layer 52 is formed over the surface of the wafer 12. This seed layer 52 is formed within the central portion of the wafer 18 but is formed so that it does not overly the edge exclusion portion 20 of the wafer as shown in FIG. 6. In a preferred form, especially when the layer 50 is formed of a material that is readily oxidizable when exposed to oxygen, the layer 52 and the layer 50 are formed insitu to one another within a same chamber without breaking vacuum (e.g., a cluster tool is used to deposit both layer 50 and 52 without the need to break vacuum). This is done to prevent the portion of layer 50 which lie within the contact openings 22 and 24 from oxidizing and thereby increasing the contact resistance. In a preferred form, layer 52 is a layer of copper formed by physical vapor deposition (PVD). The physical vapor deposition (PVD) used to form the layer 52 is typically collimated in a 1:1 ratio. The thickness of the layer 52 varies between roughly 1000 angstroms and 4000 angstroms depending upon varying process constraints (contact aspect ratio and thermal constraints) and IC product types. The layer 52, due to its PVD formation, is slightly nonconformal as illustrated in FIG. 6. The layer 52 can also be deposited by any other method such as CVD, high density plasma processing, sputtering, and the like.

After the copper seed layer 52 is formed overlying the intermediate layer 50, the wafer is removed from the vacuum environment and exposed to an ambient. The ambient may either be a cleanroom ambient or it may be a thermally oxidizing ambient which is provided briefly from a thermal growth processing chamber. In either case, exposure to any level of oxygen will result in some native oxidation of exposed portions of the intermediate layer 50. In many cases, this native oxidation alone will be enough to entirely consume exposed portions of the layer 50 whereby the silicon in the exposed portions of the layer 50 form $SiO_x$.

FIG. 6 illustrates that the edge exclusion region 20 contains exposed portions of the intermediate layer 50 whereby this portion of the intermediate layer 50 is readily oxidized either via a native oxide mechanism or by a thermal oxide step to form an oxide region 50*a* from layer 50. If the region 50 is formed via exposure to a silane plasma, the region 50*a* is a silicon oxide usually of the form $SiO_2$. Therefore, in FIG. 6, the layer 50 underlying and protected by the seed layer 52 remains conductive/semiconductive and unoxidized while exposed portions of the intermediate layer 50 are oxidized to form an exclusion region protection layer 50*a* in FIG. 6.

Figure 7:
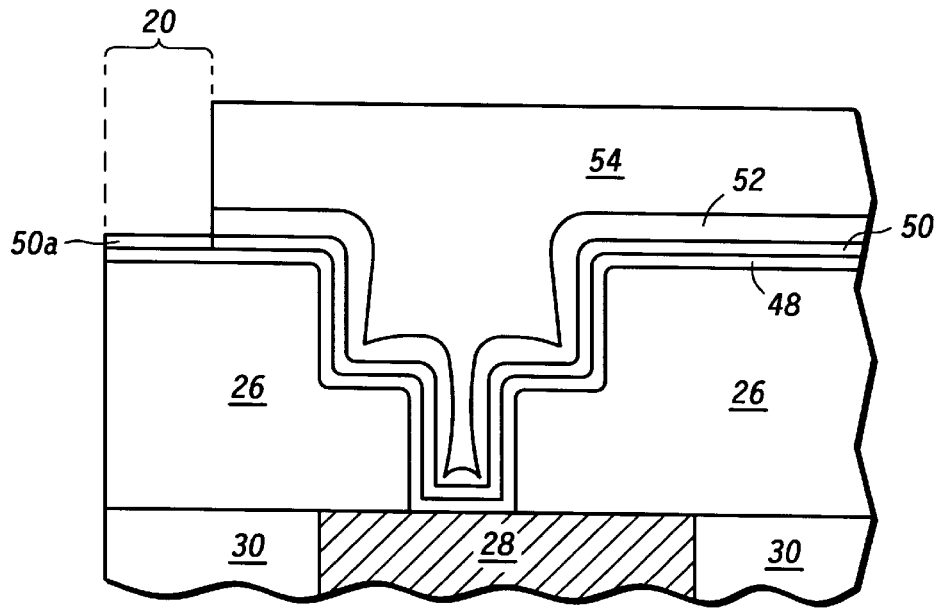
Figure 8:
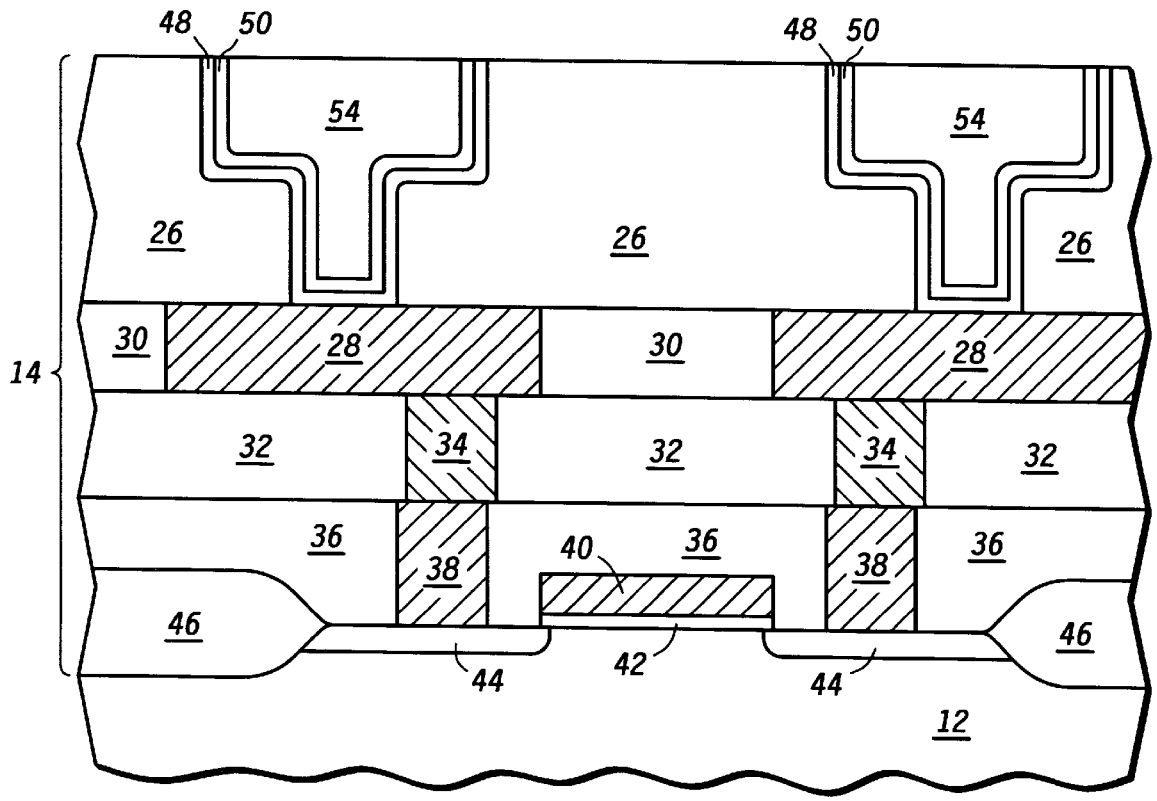
FIG. 8 illustrates, in a cross sectional diagram, a typical integrated circuit portion which is fabricated in accordance with the present invention.

FIG. 7 illustrates that the wafer 12 is then exposed to a liquid electroplating environment in an electroplating chamber which are available in the art via Sematool. The copper (Cu) electroplating environment will result in copper adhering to the seed layer 52 wherein no copper or a negligible amount of copper will be electroplated on the surface oxide 50*a* in the exclusion region 20 of FIG. 7. Electroplating continues to occur from the seed layer 52 and continues to be prevented on the oxide 50*a* until a thick copper interconnect layer 54 is formed as illustrated in FIG. 7. This copper interconnect and any conductive layer taught herein may be chemically mechanically polished (CMP) in order to improve planarity or form dual in-lain contact structures (see FIG. 8). Notice that no copper electroplating or a negligible amount of copper electroplating occurs over the oxide 50*a* in the exclusion region 20. Therefore, unlike the prior art illustrated in FIGS. 1–2 herein, no copper material 52 or 54 is directly in contact with any barrier TiN material 48. Therefor, no peeling or delamination 19 as illustrated in FIG. 2 will occur for the wafer illustrated in FIG. 7 whereby particle contamination is reduced and integrated circuit (IC) die yield is improved.

FIG. 8 illustrates a magnified central portion of FIG. 3 as defined in the drawings. FIG. 8 clearly illustrates the wafer silicon substrate 12 of FIG. 3. Active devices, such as the transistor clearly illustrated in FIG. 8, are formed overlying the semiconductor substrate 12. The transistor of FIG. 8 contains source and drain electrodes 44 separated by a channel region in the substrate 12. The transistor is isolated from other devices via field oxide regions 46 or like isolation structures such as dielectric-filled trenches. A gate oxide 42 is illustrated in FIG. 8 along with an overlying gate electrode 40. The gate electrode 40 is typically formed from polysilicon or amorphous silicon doped to a predetermined level.

An inter-level dielectric (ILD) 36 is then formed from one or more of TEOS and/or borophosphosilicate glass (BPSG). Contacts are lithographically patterned and etched through the ILD 36 to form tungsten (W) plugs 38 as illustrated in FIG. 8. Tungsten plugs typical comprise barriers similar to that taught herein for dual-inlaid copper structures. A second level of processing is used to form tungsten (w) plugs 34 as well as a second inter-level dielectric layer 32 as illustrated in FIG. 8. After formation of the tungsten plugs 34 and the ILD 32, the processing of FIGS. 3–7 commences as previously described.

As fully discussed in FIGS. 3–7, the layers 26, 28, 30, 48, 50, 52, and 54 are formed as illustrated in FIGS. 3–7 to complete the IC 14 illustrated in part by FIG. 8. Note that the layer 52 and the layer 54 are preferably formed from the same copper material. Therefore, it will be difficult to discriminate the boundary between the layer 52 and the layer 54 in the final device. Therefore, the composite of 52 and 54 is simply referred to as region 54 in FIG. 8. Furthermore, a chemical mechanical processing (CMP) operation is utilized in order to polish upper portions of the layer 54 to result in dual in-laid contacts as illustrated in FIG. 8. Note that FIG. 8 illustrates that the contact portions comprise the barrier 48, the intermediate conductive layer portion 50, and the copper interconnect 52 and 54. As previously noted, the very thin, optionally doped, and conductive layer 50 will not adversely affect the contact resistance of the dual in-laid structures of FIG. 8. While not affecting resistance, the dual in-laid structure of FIG. 8 is improved over the contact structure formed via the process of FIGS. 1 and 2 due to improved prevention of copper electroplating within the edge exclusion region 20.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, additional barrier layers other than layers 48 and 50 can be placed within a dual in-laid contact opening before the copper is formed. Therefore, it is intended that this invention encompass all the variations and modifications as fall within the scope of the appended claims.

What is claimed is:

1. A method for making a metal layer on a surface of a substrate, the method comprising the steps of:

providing the substrate having an edge surface portion and a central surface portion;

forming a metallic layer overlying a surface of the substrate, the metallic layer overlying both the edge surface portion and the central surface portion of the substrate;

forming an intermediate layer overlying the metallic layer;

depositing a seed layer overlying the intermediate layer wherein the seed layer overlies the central surface portion but does not overly the edge surface portion whereby a portion of the intermediate layer in the edge surface portion is exposed to form an exposed intermediate layer portion; and electroplating a metallic region from the seed layer wherein the exposed intermediate layer portion prevents electroplating within the edge surface portion of the substrate.

2. The method of claim 1 wherein the step of forming the intermediate layer further comprises:

oxidizing the exposed intermediate layer portion by exposure to an ambient environment containing oxygen.

3. The method of claim 1 wherein the step of forming the intermediate layer further comprises:

forming the intermediate layer as a layer of magnesium.

4. The method of claim 1 wherein the step of forming the intermediate layer further comprises:

forming the intermediate layer as a layer of silicon.

5. The method of claim 1 wherein the step of forming the intermediate layer further comprises:

forming the intermediate layer as a layer of germanium.

6. The method of claim 1 wherein the step of forming the intermediate layer further comprises:

forming the intermediate layer as a layer of aluminum.

7. The method of claim 1 wherein the step of providing the substrate further comprises:

providing the substrate as a silicon wafer.

8. The method of claim 1 wherein the step of forming the metallic layer further comprises:

forming the metallic layer as a layer of TiN.

9. The method of claim 1 wherein the step of electroplating the metallic region further comprises:

electroplating copper to form an electrical interconnect comprising copper.

10. The method of claim 1 wherein the step of electroplating the metallic region further comprises:

electroplating copper to form an electrical dual-inlaid interconnect comprising copper.

11. The method of claim 1 wherein the step of forming the intermediate layer further comprises:

exposing the metallic layer to a silicon source which is energized by a plasma whereby the intermediate layer is formed as a thin silicon layer which reacts with the metallic layer to form a silicide region.

12. The method of claim 1 wherein the step of forming the intermediate layer further comprises:

exposing the metallic layer to a silane gas which is energized by a plasma.

13. The method of claim 1 wherein the step of forming the intermediate layer further comprises:

forming the intermediate layer as a layer of material which is less than 20 angstroms in thickness.

14. The method of claim 1 wherein the step of forming the intermediate layer further comprises:

forming the intermediate layer as a layer of material which is approximately 6 angstroms in thickness.

15. The method of claim 1 wherein the step of forming the intermediate layer further comprises:

forming the intermediate layer via exposure to a silane plasma operating with a substrate temperature of less than 450° C., a chamber pressure of roughly 100 mTorr to 3 Torr, and a silane flow of roughly 1 ccm to 100 ccm.

16. The method of claim 1 wherein the step of forming the intermediate layer further comprises:

forming the intermediate layer insitu with the seed layer without breaking vacuum in order to avoid oxidation of intermediate layer portions which directly underlie the seed layer.

17. A method for making a copper layer on a surface of a semiconductor wafer, the method comprising the steps of:

provviding the semiconductor wafer having an edge surface portion around a periphery of the semiconductor wafer and a central surface portion near a center of the semiconductor wafer;

forming a first metal interconnect layer;

forming an inter-level dielectric layer overlying the first metal interconnect layer;

forming at least one opening through the inter-level dielectric layer, the at least one opening through the inter-level dielectric layer having a trench portion and a via portion wherein the via portion contacts to the first metal interconnect layer;

forming a barrier layer within the at least one opening, the barrier layer comprising titanium;

forming a silicon-comprising layer overlying the barrier layer;

forming a copper seed layer overlying the silicon-comprising layer wherein the copper seed layer exposes a portion of the silicon-comprising layer which overlies the edge surface portion of the semiconductor wafer;

oxidizing the portion of the silicon-comprising layer which overlies the edge surface portion to form an oxide region over the edge surface portion; and exposing the copper seed layer and the oxide region to a copper electroplating environment wherein copper is electroplated onto the copper seed layer while the oxide region substantially prevents copper electroplating within the edge surface portion.

18. The method of claim 17 wherein the silicon-comprising layer is a silicon layer which is at least partially silicided due to exposure to the barrier layer comprising titanium to form a refractory silicide.

19. The method of claim 17 wherein the silicon-comprising layer is formed over a surface of the barrier layer via exposure of the barrier layer to a silane plasma environment.

20. The method of claim 17 wherein the silicon-comprising layer is formed insitu with the copper seed layer without breaking vacuum so that portions of the silicon-comprising layer directly underlying the copper seed layer are unoxidized.

21. The method of claim 17 wherein the silicon-comprising layer has a thickness between 2 Angstroms and 10 Angstroms.

22. The method of claim 17 wherein the silicon-comprising layer is formed by a silane plasma at a temperature of less than 450° C.

23. The method of claim 17 wherein the barrier layer comprises TiN.

24. A method for making a conductive layer comprising copper on a surface of a semiconductor wafer, the method comprising the steps of:

depositing a barrier region overlying the semiconductor wafer;

placing the semiconductor wafer containing the barrier region into a vacuum environment;

exposing the barrier region to a silane plasma in the vacuum environment to form a thin silicon-comprising layer on a surface of the barrier region;

without breaking the vacuum environment, forming a copper seed layer over the thin silicon-comprising layer, the copper seed layer forming covered portions of the thin silicon-comprising layer and uncovered portions of the thin silicon-comprising layer;

removing the semiconductor wafer from the vacuum environment whereby the uncovered portions of the thin silicon-comprising layer oxidize to form an oxide region and the covered portions of the thin silicon-comprising layer are protected from oxidation; and electroplating copper from the copper seed layer whereby the oxide region does not substantially electroplate copper.

25. The method of claim 24 wherein the barrier region comprises TiN.

* * * * *